United States Patent
Tam et al.

(10) Patent No.: US 7,990,780 B2
(45) Date of Patent: Aug. 2, 2011

(54) MULTIPLE THRESHOLD VOLTAGE REGISTER FILE CELL

(75) Inventors: Honkai Tam, Redwood City, CA (US); Sribalan Santhanam, Palo Alto, CA (US); Jung-Cheng Yeh, San Jose, CA (US); Sanjay P. Zambare, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 175 days.

(21) Appl. No.: 12/390,247

(22) Filed: Feb. 20, 2009

(65) Prior Publication Data

US 2010/0214815 A1 Aug. 26, 2010

(51) Int. Cl.
*G11C 7/00* (2006.01)
(52) U.S. Cl. ......... 365/189.14; 365/189.15; 365/189.16
(58) Field of Classification Search ............ 365/174, 365/175, 184, 154, 156, 189.14, 189.15, 365/189.16, 189.03
See application file for complete search history.

(56) References Cited

U.S. PATENT DOCUMENTS

| | | | |
|---|---|---|---|
| 5,299,158 A | 3/1994 | Mason et al. | |
| 5,671,187 A | 9/1997 | Childers et al. | |
| 5,828,623 A | 10/1998 | Dilbeck | |
| 5,894,432 A | 4/1999 | Lotfi | |
| 5,923,608 A | 7/1999 | Payne | |
| 6,038,192 A | 3/2000 | Clinton et al. | |
| 6,038,274 A | 3/2000 | Ribeiro Filho et al. | |
| 6,163,473 A | 12/2000 | Hannum | |
| 6,172,894 B1 | 1/2001 | Hannum | |
| 6,333,894 B1 | 12/2001 | Nakayama et al. | |
| 6,343,348 B1 | 1/2002 | Tremblay et al. | |
| 6,542,423 B1 | 4/2003 | Kalyanasundharam et al. | |
| 6,782,521 B2 | 8/2004 | Iadonato et al. | |
| 7,187,606 B1 | 3/2007 | Goel | |
| 7,277,353 B2 | 10/2007 | Goel | |
| 2004/0079978 A1* | 4/2004 | Kang et al. | 257/300 |
| 2004/0156228 A1* | 8/2004 | Becker | 365/154 |
| 2006/0083074 A1 | 4/2006 | Cottier et al. | |
| 2006/0198181 A1* | 9/2006 | Luk et al. | 365/154 |
| 2009/0168496 A1* | 7/2009 | Mikan et al. | 365/154 |

\* cited by examiner

*Primary Examiner* — Richard Elms
*Assistant Examiner* — Hien N Nguyen
(74) *Attorney, Agent, or Firm* — Lawrence J. Merkel; Meyertons, Hood, Kivlin, Kowert & Goetzel, P.C.

(57) ABSTRACT

A memory circuit may include a pair of cross-coupled inverters configured to store a bit of data and a first transistor coupled to a first node of the pair of cross-coupled inverters. A plurality of transistors that form the pair of inverters have a first nominal threshold voltage. The first transistor is coupled to a first bit line, and has a second nominal threshold voltage that is lower than the first nominal threshold voltage. The first transistor may be a write transistor and another write transistor having the second nominal threshold voltage is coupled to the other node of the pair of cross-coupled inverters. A register file may include a bit storage section that includes at least one pair of the cross-coupled inverters; a write transistor section and a read transistor section having the second nominal threshold voltage.

17 Claims, 3 Drawing Sheets

MULTIPLE THRESHOLD VOLTAGE REGISTER FILE CELL

BACKGROUND

1. Field of the Invention

This invention is related to integrated circuits and, more particularly, to register files and other memory circuits in an integrated circuit.

2. Description of the Related Art

As integrated circuit fabrication process technology has continued to progress, reducing the feature sizes of transistors with each new process node, the supply voltage to the integrated circuit has also continued to decrease. Additionally, as the operating frequencies increase (made possible in part by the continued process technology advancement), the reduced supply voltage has contributed to reduced power consumption.

However, one limit to the reduction of supply voltage that is experienced in integrated circuits that integrate memories (such as SRAM) is related to the robustness of the memory. As supply voltage decreases below a certain voltage, the ability to reliably read and write the memory decreases. The reduced reliability may have several sources. The resistances of some devices in the memory (e.g. the pass gate transistors that couple bit lines to memory cells in an SRAM) may change as the supply voltage falls. The changed resistance may impact the ability to overdrive the memory cell for a write. Accordingly, the "trip point" (the point at which a write to a memory cell occurs) as a percentage of the supply voltage worsens as the supply voltage is decreased. Similarly, the ability to quickly and/or reliably read the memory decreases.

SUMMARY

In one embodiment, a memory circuit includes a storage cell, such as a pair of cross-coupled inverters, configured to store at least one bit of data. A write transistor is coupled to a first node of the storage cell. The transistors that form the storage cell have a first nominal threshold voltage. The write transistor is coupled to a first bit line, and has a second nominal threshold voltage that is lower than the first nominal threshold voltage.

In an embodiment, a register file comprises a bit storage section comprising at least one storage cell. The transistors forming the storage cell have a first nominal threshold voltage. Additionally, the register file includes a write transistor section comprising a first set of transistors that are coupled to the storage cell and a read transistor section comprising a second set transistors that are coupled to the inverters. The first and second sets of transistors have a second nominal threshold voltage that is lower than the first nominal threshold voltage. The write transistor section is physically located on one side of the bit storage section, and the read transistor section is physically located on the opposite side of the bit storage section.

In one embodiment, a memory circuit comprises a pair of cross-coupled inverters configured to store a bit of data, wherein the transistors that form the pair of inverters having a first nominal threshold voltage. A read transistor has a gate terminal coupled to a first node of the pair of cross-coupled inverters, and has a second nominal threshold voltage that is lower than the first nominal threshold voltage.

BRIEF DESCRIPTION OF THE DRAWINGS

The following detailed description makes reference to the accompanying drawings, which are now briefly described.

Figure 1:
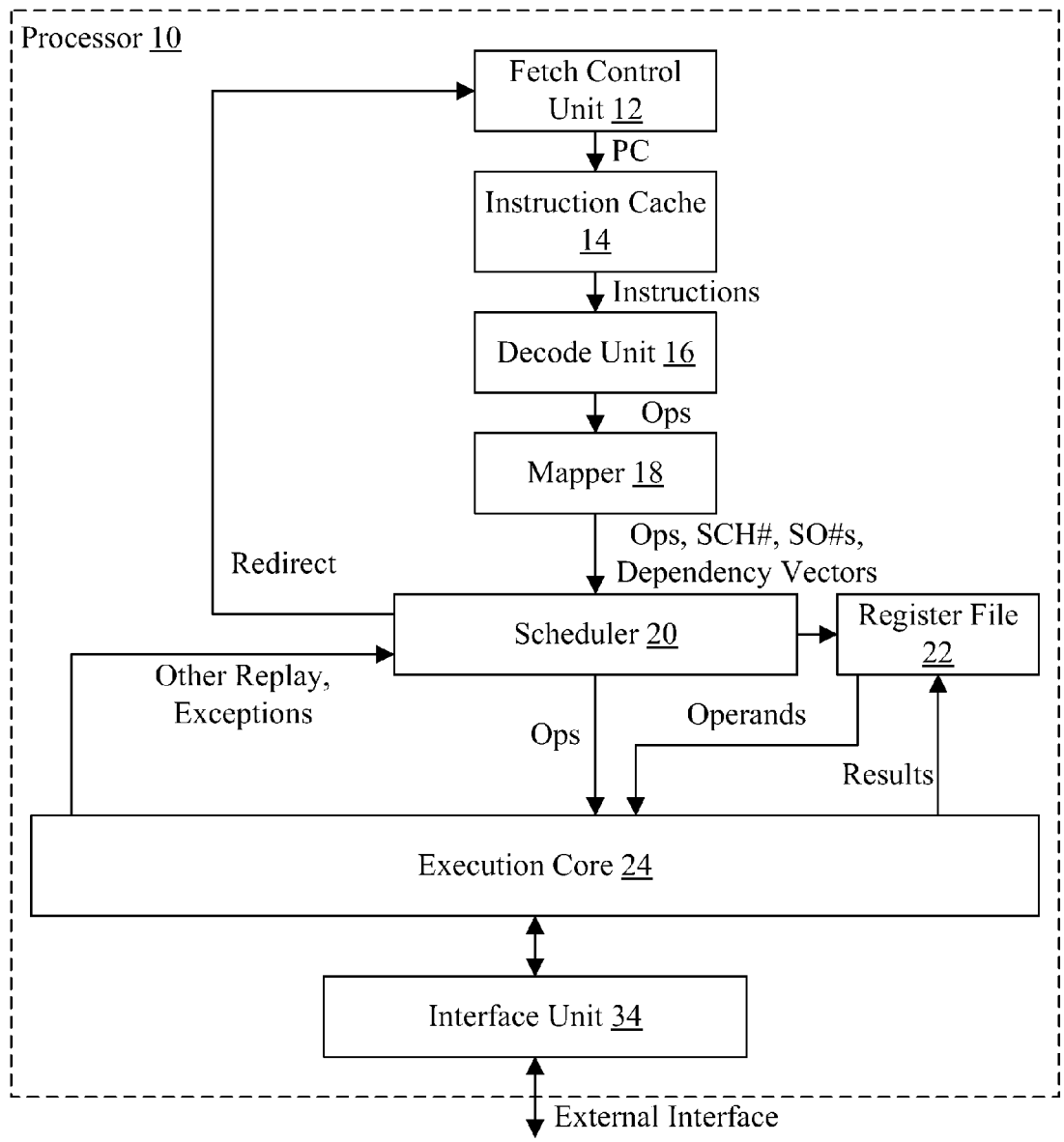
FIG. 1 is a block diagram of one embodiment of a processor.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean "including, but not limited to".

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits to implement the operation. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

In one embodiment, a register file is described which includes memory including transistors of differing nominal threshold voltages. Specifically, the pass gate transistors that couple write bit lines to the bit cell, and the transistors which are used to read data from the bit cell, may have a lower nominal threshold voltage than the transistors that form the storage in the bit cell. The pass gate transistors may thus provide a stronger drive current (a lower resistance) and thus may more reliably overwrite the bit cell with a new value. The higher nominal threshold voltage of the storage transistors may reduce the leakage current in the memory, lowering power dissipation. In one embodiment, at least some of the transistors may be long channel length transistors, to further reduce leakage current. In one embodiment, all of the transistors in the memory may be long channel length transistors.

The nominal threshold voltage may be the threshold voltage expected of the transistor based on the design of the transistor (e.g. channel length, oxide thickness and material, etc.). For a given process technology node, there may be two or more types of transistors available with differing threshold voltages. For example, in one embodiment described in more detail below, there are four types of transistors available (listed from lowest threshold voltage to highest threshold voltage): super low threshold voltage (SLVT), low threshold voltage (LVT), regular threshold voltage (RVT), and high threshold voltage (HVT). The threshold voltage is referred to as nominal because in practice the actual threshold voltage may vary based on process variations, as well as operating conditions such as temperature.

The threshold voltage may generally refer to the voltage at the gate terminal of the transistor (with respect to the source), at or above which the transistor actively conducts current between the source and drain. Viewed in another way, the threshold voltage may be the voltage at which a low resistance current path is formed from the source to the drain. When the gate to source voltage is less than the threshold voltage, the transistor is not actively conducting current. Leakage current may be flowing when the gate to source voltage is less than the threshold voltage, but the leakage current is significantly smaller than the active current (e.g. by orders of magnitude). The transistor is referred to as "on" when the gate to source voltage exceeds the threshold voltage and "off" when the gate to source voltage does not exceed the threshold voltage.

While a register file embodiment is described in more detail below, other types of memories may make use of the mixed threshold voltage transistor design.

Turning now to FIG. 1, a block diagram of one embodiment of a processor 10 is shown. In the illustrated embodiment, the processor 10 includes a fetch control unit 12, an instruction cache 14, a decode unit 16, a mapper 18, a scheduler 20, a register file 22, an execution core 24, and an interface unit 34. The fetch control unit 12 is coupled to provide a program counter (PC) for fetching from the instruction cache 14. The instruction cache 14 is coupled to provide instructions to the decode unit 16, which is coupled to provide decoded instruction operations (ops) to the mapper 18. The mapper 18 is coupled to provide ops, a scheduler number (SCH#), source operand numbers (SO#s), and one or more dependency vectors to the scheduler 20. The scheduler 20 is coupled to receive replay and exception indications from the execution core 24, is coupled to provide a redirect indication to the fetch control unit 12, is coupled to the register file 22, and is coupled to provide ops for execution to the execution core 24. The register file is coupled to provide operands to the execution core 24, and is coupled to receive results to be written to the register file 22 from the execution core 24. The execution core 24 is coupled to the interface unit 34, which is further coupled to an external interface of the processor 10.

The fetch control unit 12 may comprise any circuitry configured to generate PCs for fetching instructions. The fetch control unit 12 may include, for example, branch prediction hardware configured to predict branch instructions and to fetch down the predicted path. The fetch control unit 12 may also be redirected (e.g. via misprediction, exception, interrupt, flush, etc.). In the illustrated embodiment, the redirection may be provided by the scheduler 20. In other embodiments, redirection may be provided by the execution core 24, or some redirects may be provided from the execution core 24 while others are provided from the scheduler 20.

The instruction cache 14 may be a cache memory for storing instructions to be executed by the processor 10. The instruction cache 14 may have any capacity and construction (e.g. direct mapped, set associative, fully associative, etc.). The instruction cache 14 may have any cache line size. For example, 64 byte cache lines may be implemented in one embodiment. Other embodiments may use larger or smaller cache line sizes. In response to a given PC from the fetch control unit 12, the instruction cache 14 may output up to a maximum number of instructions.

The decode unit 16 may generally be configured to decode the instructions into instruction operations (ops). Generally, an instruction operation may be an operation that the hardware included in the execution core 24 is capable of executing. Each instruction may translate to one or more instruction operations which, when executed, result in the performance of the operations defined for that instruction according to the instruction set architecture. In some embodiments, each instruction may decode into a single instruction operation. The decode unit 16 may identify the type of instruction, source operands, etc., and the decoded instruction operation may comprise the instruction along with some of the decode information. In other embodiments in which each instruction translates to a single op, each op may simply be the corresponding instruction or a portion thereof (e.g. the opcode field or fields of the instruction). In some embodiments in which there is a one-to-one correspondence between instructions and ops, the decode unit 16 and mapper 18 may be combined and/or the decode and mapping operations may occur in one clock cycle. In other embodiments, some instructions may decode into multiple instruction operations. In some embodiments, the decode unit 16 may include any combination of circuitry and/or microcoding in order to generate ops for instructions. For example, relatively simple op generations (e.g. one or two ops per instruction) may be handled in hardware while more extensive op generations (e.g. more than three ops for an instruction) may be handled in microcode.

Ops generated by the decode unit 16 may be provided to the mapper 18. The mapper 18 may implement register renaming to map source register addresses from the ops to the source operand numbers (SO#s) identifying the renamed source registers. Additionally, the mapper 18 may be configured to assign a scheduler entry to store each op, identified by the SCH#. In one embodiment, the SCH# may also identify the rename register assigned to the destination of the op. In other embodiments, the mapper 18 may be configured to assign a separate destination register number. Additionally, the mapper 18 may be configured to generate a dependency vector for the op. The dependency vectors may identify the ops on which a given op is dependent. In one embodiment, dependencies are indicated by the SCH# of the corresponding ops, and the dependency vector bit positions may correspond to SCH#s. In other embodiments, dependencies may be recorded based on register numbers and the dependency vector bit positions may correspond to the register numbers.

The mapper 18 may provide the ops, along with SCH#, SO#s, and dependency vectors for each op to the scheduler 20. The scheduler 20 may be configured to store the ops in the scheduler entries identified by the respective SCH#s, along with the SO#s. The scheduler may be configured to store the dependency vectors in dependency arrays that evaluate which ops are eligible for scheduling. The scheduler 20 may be configured to schedule the ops for execution in the execution core 24. When an op is scheduled, the scheduler 20 may be configured to read its source operands from the register file 22 and the source operands may be provided to the execution core 24. The execution 24 may be configured to return the results of ops that update registers to the register file 22. In some cases, the execution core 24 may forward a result that is to be written to the register file 22 in place of the value read from the register file 22 (e.g. in the case of back to back scheduling of dependent ops).

The register file 22 may generally comprise any set of registers configured to store operands and results of ops executed in the processor 10. In some embodiments, the register file 22 may comprise a set of physical registers and the mapper 18 may map the logical registers to the physical registers. The logical registers may include both architected registers specified by the instruction set architecture implemented by the processor 10 and temporary registers that may be used as destinations of ops for temporary results (and sources of subsequent ops as well). In other embodiments, the register file 22 may comprise an architected register set containing the committed state of the logical registers and a speculative register set containing speculative register state.

The interface unit 24 may generally include the circuitry for interfacing the processor 10 to other devices on the external interface. The external interface may comprise any type of interconnect (e.g. bus, packet, etc.). The external interface may be an on-chip interconnect, if the processor 10 is integrated with one or more other components (e.g. a system on a chip configuration). The external interface may be on off-chip interconnect to external circuitry, if the processor 10 is not integrated with other components.

In various embodiments, the processor 10 may implement any instruction set architecture. It is noted that, while the processor 10 illustrated in FIG. 1 is one implementation, many other implementations are possible which could implement a register file such as that described herein.

Figure 2:
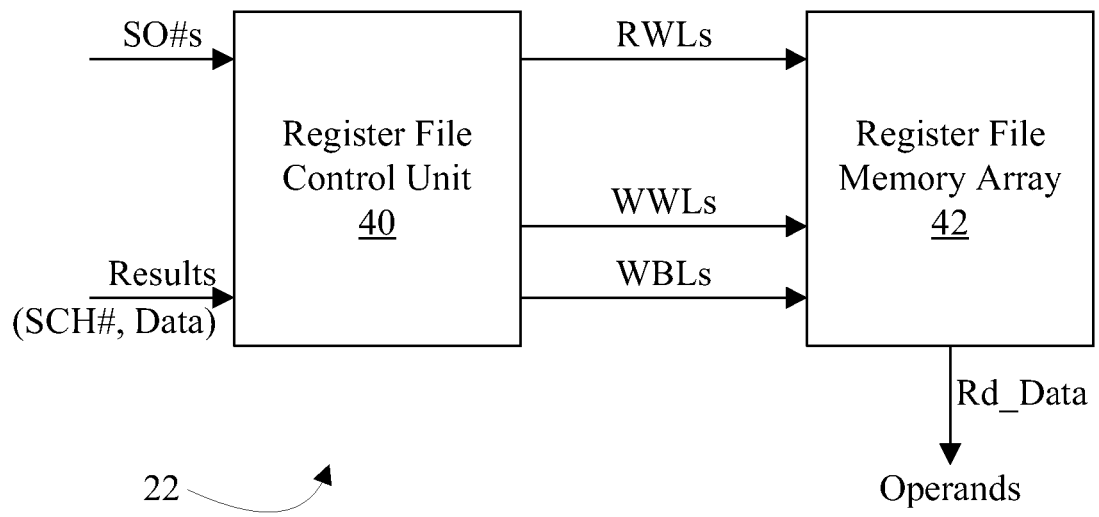
FIG. 2 is a block diagram of one embodiment of a register file shown in FIG. 1.

Turning now to FIG. 2, a block diagram of one embodiment of the register file 22 is shown. In the illustrated embodiment, the register file 22 includes a register file control unit 40 and a register file memory array 42. The register file control unit 40 is coupled to receive the SO#s (register addresses) from the scheduler 20, as well as the results from the execution core 24. The results include the SCH# of the instruction (which is also a destination register address) and the data to be written.

Each SO# is connected to a different read port on the register file 22. The register file memory array 42 may thus include an independent read path for each read port, permitting multiple registers to be read in parallel. The register file control unit 40 may be configured to decode the SO#s into a set of read word lines (RWLs). There is a set of RWLs for each port, and the set of RWLs includes a signal for each register represented in the register file 22. The RWL corresponding to the SO# may be asserted (high, in this embodiment) by the register file control unit 40. The register file memory array 42 is configured to read the corresponding entries in the memory and output read data (Rd_Data) for each read port, which are the operands illustrated in FIG. 1.

Each result is coupled to a different write port on the register file 22. The register file control unit 40 may decode each SCH# into a set of write word lines (WWLs). Like the RWLs, there is a set of WWLs for each write port, and the set of WWLs includes a signal for each register in the register file 22. The WWL corresponding to the SCH# may be asserted (high, in this embodiment) to select the entry to be written. The result data may be also be decoded into a set of write bit lines (WBLs). There may be a pair of WBLs for each bit of result data: a true bit signal equal to the result data bit and a complement bit signal equal to the inverse of the result data bit. The true bit signal is illustrated herein as WBL, and the complement bit signal is illustrated as WBL_. The register file memory array 42 may be configured to update the selected entry with the result data.

Figure 3:
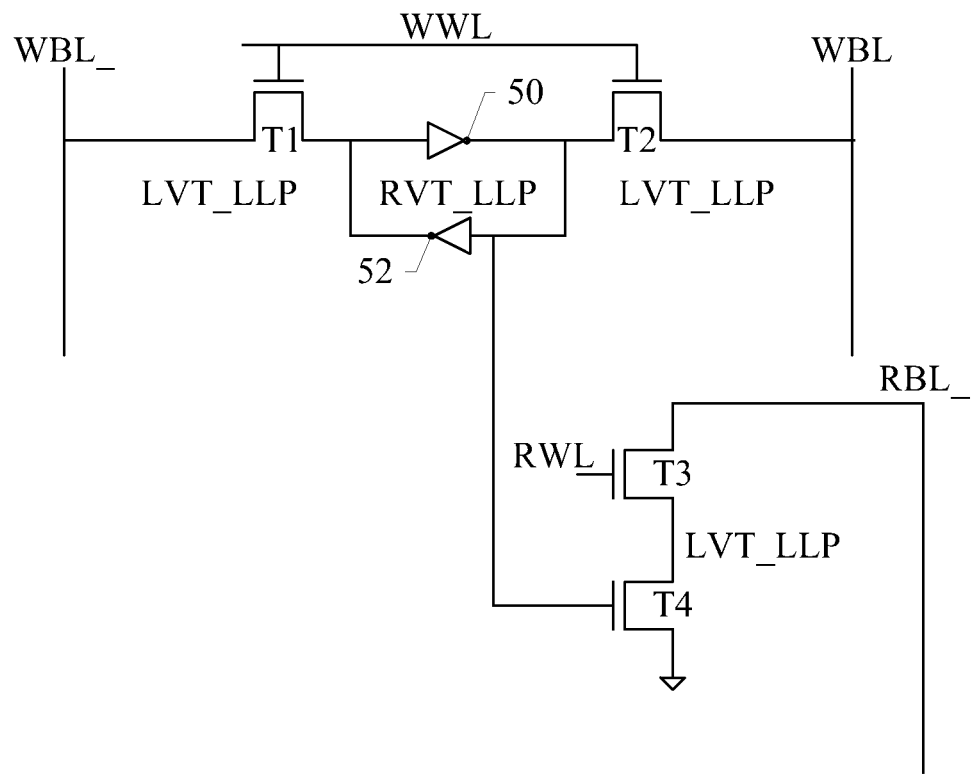
FIG. 3 is a circuit diagram of one embodiment of a cell for the register file shown in FIG. 2.

Turning now to FIG. 3, a circuit diagram of one embodiment of a bit cell that may be implemented in one embodiment of the register file memory array 22 is shown. There may be a copy of the bit cell shown in FIG. 3 for each bit of a given register, coupled to the same WWL and RWL but different WBL, WBL_, and RBL_ lines. Other sets of bit cells correspond to each bit of other registers, coupled to other WWLs and RWLs. The same bit location of each register may be coupled to the same WBL, WBL_, and RBL_ lines, but different WWL and RWL lines. In the embodiment of FIG. 3, the bit cell includes a pair of cross-coupled inverters 50 and 52, write transistors T1 and T2, and read transistors T3 and T4. The write transistors T1 and T2 are coupled to the two nodes of the pair of cross-coupled inverters: transistor T1 to the node at the output of the inverter 52 and the input of the inverter 50; and the transistor T2 to the node at the output of the inverter 50 and input of the inverter 52. The gate terminals of the transistors T1 and T2 are coupled to receive the WWL signal, and the other terminal of transistors T1 and T2 are coupled to the WBL_ and WBL bit line signals, respectively. The gate terminal of the transistor T4 is coupled to the node at the output of the inverter 50 and the input of the inverter 52, and the transistor T4 is coupled in series with the transistor T3. The gate terminal of the transistor T3 is coupled to the RWL, and the other terminal of the transistor T3 is coupled to the RBL_.

The transistors that form the inverters 50 and 52 may have nominal threshold voltages that are higher than the threshold voltages of the other transistors T1-T4 in the bit cell. For example, the inverters 50 and 52 may be formed from RVT transistors (RVT_LLP label in FIG. 3) and the transistors T1-T4 may be formed from LVT transistors (LVT_LLP labels in FIG. 3). By forming the transistors T1 and T2 from lower threshold voltage transistors, the drive strength of the transistors as compared to the inverters 50 and 52 may be increased. Accordingly, the ability to write the bit cell reliably may be increased as compared to a bit cell in which the transistors all have the same nominal threshold voltage. Additionally, the use of the RVT transistors in the inverters 50 and 52 may reduce the leakage current in the bit cell. In this embodiment, the transistors T3 and T4 are also LVT transistors. Implementing the transistors T3 and T4 as LVT transistors may speed the operation of the read at low voltages. Additionally, using RVT transistors in the inverters 50 and 52 may provide good data retention at low voltage (e.g. as measured by static noise margin) while still being reliably written using the LVT transistors T1 and T2.

In one embodiment, all of the transistors in the bit cell are long channel length transistors (the _LLP in the labels indicates the long channel length). Typical transistors of each threshold voltage type may have a minimum channel length specified for the process. Long channel length transistors have a non-minimum channel length (e.g. the channel may 1.5 times the minimum, or 2 or 3 times the minimum). Longer channel lengths may also reduce leakage current. Since the transistors T1-T4 are LVT, and since lower threshold voltages correlate to higher leakage currents, the longer channel lengths may recapture some of the added leakage current that is incurred by selecting the LVT transistors.

To write the bit cell in FIG. 3, the WWL signal may be asserted high, activating the transistors T1 and T2. Additionally, the data bit to be written is driven on the WBL line and the complement of the bit is driven on the WBL_ line. Accordingly, the value of the bit is stored on the node at the output of the inverter 50, and the complement of the bit is stored on the node at the output of the inverter 52. If, prior to the write operation, the cross-coupled inverters 50 and 52 are storing the opposite state of the bit being written, the inverters 50 and 52 drive against the transistors T1 and T2. The higher current capability of the LVT transistors may aid in the transistors T1 and T2 overcoming the inverters 50 and 52, and overwriting the previously stored bit with the newly stored bit.

As mentioned previously, the node at the output of the inverter 50 stores the value of the bit stored in the bit cell. The gate terminal of the transistor T4 is coupled to the true node at the output of the inverter 50 and the input of the inverter 52. Accordingly, if a logical 0 is stored in the bit cell, the gate terminal of the transistor T4 is low and the transistor T4 is deactivated. When the RWL line is asserted high, the transistors T3 and T4 do not drain the RBL_ line and thus output a zero from the cell. That is, the RBL_ line is the complement of the bit stored in the cell when the cell is read. If a logical 1 is stored in the bit cell, the gate terminal of the transistor T4 is high and the transistor T4 is active. The RBL_ line may be drained when the transistor T3 is activated by an asserted RWL line, outputting a logical one from the bit cell.

The transistors T1 and T2, connected to the WWL, WBL, and WBL_ lines as illustrated in FIG. 3, form one write port to the bit cell. If additional write ports are desired, additional transistors similar to T1 and T2 may be connected to the nodes of the cross-coupled inverters 50 and 52. The transistors would be connected to other word lines and bit lines for the additional port. In one embodiment, up to 4 write ports may be supported. Thus, there may be WWL0-WWL3 (one for each write port) and corresponding bit lines WBL0-WBL3 and WBL0_-WBL3_.

The transistors T3 and T4, connected to the RBL_ and RWL lines as illustrated in FIG. 3, form one read port to the bit cell. If additional read ports are desired, additional transistors T3 and T4 may be connected to the node of the cross-coupled inverters 50 and 52. The transistors T3 and T4 would be connected to another read bit line and read word line for the additional port.

It is noted that, while LVT and RVT transistors are used in this embodiment, other embodiments may implement other transistor threshold voltage types as long as the inverter transistors have a higher nominal threshold voltage than the transistors T1-T4. In other embodiments, the transistors T3-T4 may not have a lower threshold voltage than the inverter transistors, if desired.

As mentioned above, the inverters 50 and 52 are referred to as "cross-coupled". Generally, a pair of inverters are cross-coupled if each inverter's output is connected to the other inverter's input. The connection permits a bit to be stored stably during times that the bit cell is not being written. The cross-coupled inverters 50 and 52 may be one embodiment of a storage cell. Other embodiments may implement any storage cell circuits that stably store a bit of data during times that the bit cell is not being written. For example, other cross-coupled inverting circuitry (e.g. NOR gates) that stably store the bit in steady state (e.g. other inputs at logical 0) may be used.

Transistors of different threshold voltage types may have different layout rules, so that the transistors are fabricated properly with the differences in fabrication process steps that are used to create transistors of the different types. Accordingly, if the transistors of the bit cell are laid out without regard to the threshold voltage types, the register file memory array 42 may occupy a larger amount of integrated circuit area than may be desirable. In one embodiment, the register file memory array 42 may implement the layout of FIG. 4 to more efficiently use integrated circuit area. Additionally, in some embodiments, adjacent areas of the same cells can be overlapped (sharing diffusion areas, gate contacts, etc.) to further save area.

Figure 4:
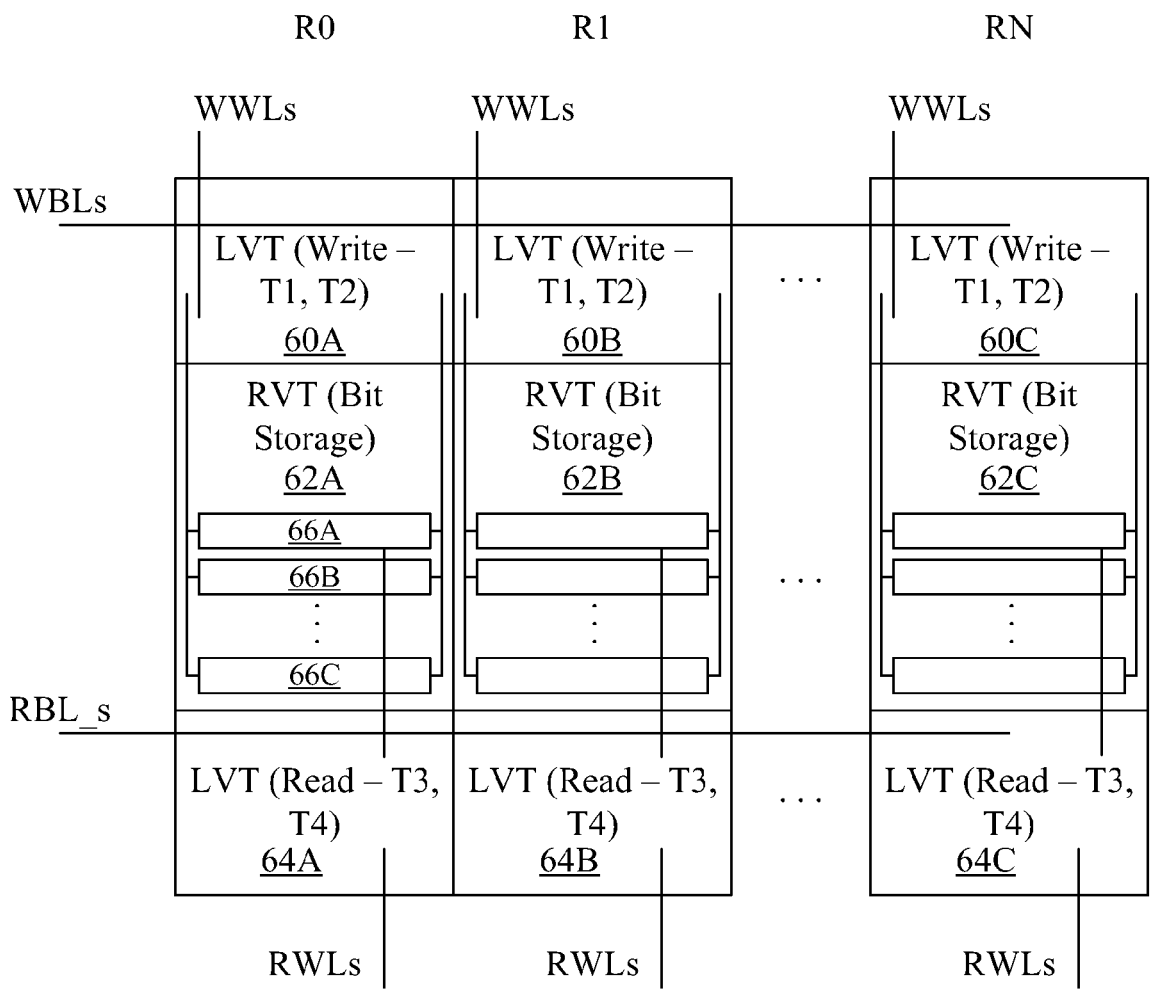
FIG. 4 is a block diagram illustrating one embodiment of a layout of circuitry for the cell shown in FIG. 3.

In FIG. 4, each register is illustrated as a vertical column, labeled R0, R1, to RN across the top. Thus, there are N+1 registers in this embodiment. In the illustrated embodiment, the bit cells are laid out in separate sections for the write transistors T1 and T2 (sections 60A, 60B, and 60C), the cross-coupled inverters (sections 62A, 62B, and 62C), and the read transistors T3 and T4 (sections 64A, 64B, and 64C). Each section 62A-62C includes at least one storage cell (e.g. at least on pair of cross-coupled inverters), and may include multiple pairs. The blocks illustrated in section 62A, for example, may each represent a different pair of cross-coupled inverters, where each pair is a different bit of register 0 (blocks 66A-66C in FIG. 4). The number of pairs of cross-coupled inverters in each section 62A-62C may vary from embodiment to embodiment. If the number in one section 62A-62C is less than the total number of bits in the register, the structure illustrated in FIG. 4 may be replicated (e.g. vertically, as illustrated in FIG. 4) to provide for other bits.

Each section in FIG. 4 includes transistors of a given threshold voltage type, and thus may be arranged more densely than would be possible if a section included transistors of more than one voltage type. The write transistor and read transistor sections are arranged on opposite sides of the bit storage sections (e.g. the write transistor sections 60A-60C are on one side of the bit storage sections 62A-62C, respectively, and the read transistor sections 64A-64C are on the opposite side of the bit storage sections 62A-62C). The bit storage sections for each bit register (R0, R1, etc. to RN) are arranged side by side in the other direction. Accordingly, horizontal strips (as illustrated in FIG. 4) of transistors having the same threshold voltage type are formed in the register file memory array 42. This layout structure may permit efficient, dense packing of the transistors in the register file 22.

The WWLs for each register are connected to the respective transistors in the sections 60A-60C as shown in FIG. 4, and the WBL and WBL_ lines for each bit location are connected to the sections 60A-60C as well. Each transistor T1 and T2 for each bit storage are coupled to the cross-coupled inverters in the bit storage sections 62A-62C (e.g. via the lines extending from the sections 60A-60C vertically into the sections 62A-62C). Additionally, the connection of the transistors T4 for each bit storage are illustrated via the line extending vertically from the sections 62A-62C to the sections 64A-64C, respectively. The output RBL_s are illustrated extending horizontally from the sections 64A-64C. The RBL_ from each section 64A-64C that corresponds to a given read port, when taken as a whole, forms the operand read from a register in the register file 22. Similarly, the WBL and WBL_ connected to each transistor T1 and T2 that corresponds a given write port over each section 60A-60C, when taken as a whole, represents the result being written to one register in the register file 22. The RWLs for each read port are connected to the gate terminals of the transistors T3 in each section 64A-64C as well.

Numerous variations and modifications will become apparent to those skilled in the art once the above disclosure is fully appreciated. It is intended that the following claims be interpreted to embrace all such variations and modifications.

What is claimed is:

1. A memory circuit comprising:
    a storage cell configured to store at least a bit of data, wherein a plurality of transistors that form the storage cell have a first nominal threshold voltage;
    a first transistor coupled to a first node of the storage cell and coupled to a first bit line, wherein the first transistor has a second nominal threshold voltage that is lower than the first nominal threshold voltage; and
    a second transistor having a gate terminal coupled to the first node, wherein the second transistor has the second nominal threshold voltage, and wherein the first transistor and the second transistor are long channel length transistors.

2. The memory circuit as recited in claim 1 wherein the first transistor has a gate terminal coupled to receive a write word line signal.

3. The memory circuit as recited in claim 2 further comprising a third transistor coupled to a second node of the storage cell, the third transistor having the second nominal threshold voltage and having the gate terminal coupled to receive the write word line signal.

4. The memory circuit as recited in claim 1 further comprising a third transistor coupled between the second transistor and a read bit line, the third transistor having a gate terminal coupled to receive a read word line signal, and the third transistor having the second nominal threshold voltage.

5. The memory circuit as recited in claim 1 wherein the plurality of transistors forming the storage cell are also long channel length transistors.

6. The memory circuit as recited in claim 1 wherein the storage cell comprises a pair of cross-coupled inverters.

7. A register file comprising:
a bit storage section comprising at least one storage cell, wherein transistors forming the storage cell have a first nominal threshold voltage;
a write transistor section comprising a first plurality of transistors that are coupled to the storage cell, wherein the first plurality of transistors have a second nominal threshold voltage that is lower than the first nominal threshold voltage, and wherein the write transistor section is physically located on a first side of the bit storage section; and
a read transistor section comprising a second plurality of transistors that are coupled to the storage cell, wherein the second plurality of transistors have the second nominal threshold voltage, and wherein the read transistor section is physically located on a second side of the bit storage section opposite the first side.

8. The register file as recited in claim 7 further comprising:
a second bit storage section comprising at least one second storage cell, wherein transistors forming the second storage cell have the first nominal threshold voltage, and wherein the second bit storage section is physically located on a third side of the bit storage section that is not the first side nor the second side;
a second write transistor section comprising a third plurality of transistors that are coupled to the second storage cell, wherein the third plurality of transistors have the second nominal threshold voltage, and wherein the second write transistor section is physically located on the first side of the second bit storage section; and
a second read transistor section comprising a fourth plurality of transistors that are coupled to the storage cell in the second bit storage section, wherein the fourth plurality of transistors have the second nominal threshold voltage, and wherein the second read transistor section is physically located on the second side of the second bit storage section.

9. The register file as recited in claim 7 wherein the at least one storage cell is included in a plurality of storage cells, and wherein the first plurality of transistors comprises pairs of transistors each coupled to a respective storage cell of the plurality of storage cells.

10. The register file as recited in claim 9 wherein the second plurality of transistors comprises series connections of transistors, each series connection coupled to the respective storage cell.

11. The register file as recited in claim 10 wherein one of the transistors in the series connection has a gate terminal coupled to a node of the respective storage cell, and wherein another one of the transistors in the series connection has a gate terminal coupled to receive a read word line signal.

12. The register file as recited in claim 9 wherein each of the second plurality of transistors includes a gate terminal coupled to receive a write word line signal.

13. The register file as recited in claim 12 wherein the pair of transistors are respectively coupled to a write bit line and a complement of the write bit line.

14. A memory circuit comprising:
a pair of cross-coupled inverters configured to store a bit of data, wherein a plurality of transistors that form the pair of inverters having a first nominal threshold voltage;
a first transistor having a gate terminal coupled to a first node of the pair of cross-coupled inverters, the first transistor having a second nominal threshold voltage that is lower than the first nominal threshold voltage; and
a second transistor coupled to the first node and a third transistor coupled to a second node of the pair of cross-coupled inverters, the second transistor and the third transistor having the second nominal threshold voltage;
wherein the first, second, and third transistors are physically located to at least one side of the plurality of transistors.

15. The memory circuit as recited in claim 14 further comprising a fourth transistor connected in series with the first transistor, wherein a gate terminal of the fourth transistor is coupled to receive a read word line signal, and wherein the fourth transistor is further connected to a read bit line.

16. The memory circuit as recited in claim 14 wherein the second transistor is coupled to a complement write bit line and the third transistor is coupled to a true write bit line.

17. The memory circuit as recited in claim 14 wherein the second transistor and the third transistor have gate terminals coupled to a write word line.

* * * * *